(12) United States Patent
Harvey

(10) Patent No.: US 7,405,564 B2
(45) Date of Patent: Jul. 29, 2008

(54) SUB-SAMPLED MOVING TABLE MRI FOR AT LEAST TWO ADJACENT FIELDS OF VIEW

(75) Inventor: Paul Royston Harvey, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 357 days.

(21) Appl. No.: 10/542,879

(22) PCT Filed: Dec. 10, 2003

(86) PCT No.: PCT/IB03/06078

§ 371 (c)(1), (2), (4) Date: Jul. 20, 2005

(87) PCT Pub. No.: WO2004/065976

PCT Pub. Date: Aug. 5, 2004

(65) Prior Publication Data

US 2006/0058630 A1 Mar. 16, 2006

(30) Foreign Application Priority Data

Jan. 20, 2003 (EP) ................................. 03100107

(51) Int. Cl.
*G01V 3/00* (2006.01)

(52) U.S. Cl. ........................ 324/307; 324/309; 324/310; 324/318

(58) Field of Classification Search ......... 324/307–322, 324/300–306; 600/407–435
See application file for complete search history.

(56) References Cited

U.S. PATENT DOCUMENTS 5,086,275 A * 2/1992 Roemer ....................... 324/309
5,398,686 A 3/1995 Inoue et al.
5,636,636 A 6/1997 Kuhn et al.

(Continued)

FOREIGN PATENT DOCUMENTS

EP 0 390 476 A2 10/1990

(Continued)

OTHER PUBLICATIONS

Brittaiin, J.H., et al.; Whole-Body Imaging with a Continuously Moving Patient Table; 2002; Proc. Intl. Soc. Mag. Reson. Med.; 10:2336.

(Continued)

*Primary Examiner*—Brij B. Shrivastav
*Assistant Examiner*—Tiffany A Fetzner

(57) ABSTRACT

A magnetic resonance method is described for forming a dynamic image from a plurality of signals of an object moving relative to at least one RF' receiving antenna. Imaging is acquired by at least two adjacent fields of view (FOV), which are reconstructed to an image over a region of interest which includes both FOVs. Prior to imaging a sensitivity map of the at least one RF receiving antenna at each position relative to the object is determined for each FOV. Thereafter data from the object to be imaged is sampled for each FOV with a reduced number of phase encoding steps with respect to the full set thereof at a fixed position relative to the main magnetic field. The image is then reconstructed from the subsampled signals, which are weighted with the sensitivity factor of the RF receiving antenna at the respective imaging position.

20 Claims, 12 Drawing Sheets

U.S. PATENT DOCUMENTS

| | | | |
|---|---|---|---|
| 7,009,396 B2 * | 3/2006 | Zhu et al. | 324/309 |
| 7,102,351 B2 * | 9/2006 | Machida et al. | 324/318 |
| 7,205,765 B2 * | 4/2007 | Machida et al. | 324/318 |
| 2002/0021128 A1 | 2/2002 | Kuhara | |
| 2003/0004408 A1 | 1/2003 | Zhu | |
| 2004/0051529 A1 * | 3/2004 | Zhu et al. | 324/318 |
| 2004/0263167 A1 * | 12/2004 | Machida et al. | 600/410 |
| 2006/0058630 A1 * | 3/2006 | Harvey | 600/410 |
| 2006/0197527 A1 * | 9/2006 | Machida et al. | 324/318 |

FOREIGN PATENT DOCUMENTS

| | | |
|---|---|---|
| EP | 1 024 371 A2 | 8/2000 |
| EP | 1 398 642 A2 | 3/2004 |
| WO | WO 99/53333 A1 | 10/1999 |
| WO | WO 02/04971 A2 | 1/2002 |

OTHER PUBLICATIONS

Kruger, D.G., et al.; Continuously Moving Table Data Acquisition Method for Long FOV Contrast-Enhanced MRA and Whole-Body MRI; 2002; MRM; 47:224-231.

Pruessmann, K.P., et al.; Coil Sensitivity Encoding for Fast MRI; 1998; Proc. ISMRM; p. 579.

Pruessmann, K.P., et al.; Coil Sensitivity Maps for Sensitivity Encoding and Intensity Correction; 1998; Proc. ISMRM; p. 2087.

Weiger, M., et al.; Cardiac Real-Time Acquisition Using Coil Sensitivity Encoding; 1998; Proc. ISMRM; p. 803.

Weiger, M., et al.; Accellerated Cardiac Breathhold Imaging Using Coil Sensitivity Encoding; 1998; Proc. ISMRM; p. 799.

* cited by examiner

Full Fov

N encodings

Full Fov

**3* N pixels**

SUB-SAMPLED MOVING TABLE MRI FOR AT LEAST TWO ADJACENT FIELDS OF VIEW

BACKGROUND

The invention relates to a magnetic resonance method for forming a fast dynamic image form a plurality of signals of an RF probe The invention further relates to a magnetic resonance imaging apparatus for obtaining a fast dynamic image and to a computer program product.

It is common practice to perform MR image acquisitions in which the patient position is physically moved through the magnet bore between a group of successive scans. At the end of this multi-station scanning, the resultant images are combined to a single large image. This approach is known e.g. from WO-A-02/04971, which allows to image a much larger FOV than the limits of the magnet homogeneity, gradient linearity and RF coil uniformity normally allow. In this document a MR imaging method is described which involves the acquisition of sets of MR signals form several scan-volumes of an object. Different spatial approaches are taken in the scanning of the respective scan-volumes. In particular respective scan-volumes include different numbers of scan-slices or scan slices of respective scan-volumes have a different slice thickness or scan-slices of respective scan-volumes have different FOV's (Fields Of View).

In U.S. Pat. No. 5,636,636 a magnetic resonance method and device is described in which an object to be examined is displaced at a defined speed relative to an examination zone and a plurality of sequences act on the examination zone in the presence of a steady, uniform magnetic filed. Each of the sequences includes at least one RF pulse and possibly a phase encoding gradient. An MR signal arising in the examination zone, after transposition to another frequency range by means of an oscillator signal, is used to produce an MR image. The method aims to enhance the quality of the MR image by preventing movement artefacts. This is achieved in that from one sequence to another, one or more of the frequency of the RF pulses, the frequency of the oscillator signal and the phase position of the oscillator signal is adjusted in conformity with the position of the object to be examined relative to the examination zone so that a part of the object which is imaged in the MR image moves relative to the examination zone in synchronism with the object.

In EP-A-1 024 371 a magnetic resonance imaging apparatus is described in which excitation pulses are applied to a restricted region of the bore of the MR imaging magnet in which the magnetic field is uniform. The data samples collected are Fourier transformed to form a volumetric image of the restricted region. A motor continuously moves a patient couch so that a region of interest passes through the region of the good field. The collected data samples are corrected to compensate for the motion so that a volumetric image is formed of greater length than that of the restricted region.

Since all the above-mentioned methods require a full scan within the restricted FOV imaging of the full object will take quite a long sampling time It is an object of the present invention to provide a method for forming an MR image from data sampled in an array of adjacent FOV's in shorter time. It is a further object of the invention to provide an adequate apparatus and a computer program product for exercising the method.

It is a main advantage of the present invention that images with suitable large FOV's are obtained with a short magnet in shorter time.

These and further advantages of the invention are disclosed in the dependent claims and in the following description in which an exemplified embodiment of the invention is described with respect to the accompanying drawings. It shows

DETAILED DESCRIPTION

Specific numbers dedicated to elements defined with respect to a particular figure will be used consistently in all figures if not mentioned otherwise.

The expression "antenna" is used as a more general term for transmitting and receiving coils. The sensitivity encoding method called "SENSE" as used in the present invention has been developed by the Institute of Biomedical Engineering and Medical Information, University and ETH Ztrich, Switzerland. The SENSE method is based on an algorithm which acts directly on the image as detected by the coils of the magnetic resonance apparatus and which subsequent encoding steps can be skipped and hence an acceleration of the signal acquisition for imaging by a factor of from two to three can be obtained. Crucial for the SENSE method is the knowledge of the sensitivity of the coils which are arranged in so called sensitivity maps. In order to accelerate this method there are proposals to use raw sensitivity maps which can be obtained through division by either the "sum-of-squares" of the single coil references or by an optional body coil reference (see e.g. K. Pruessmann et. al. in Proc. ISMRM, 1998, abstracts pp. 579, 799, 803 and 2087).

In the SENSE technique it is usually required that at least two RF receiving coils are present. Different sensitivity maps between the two REF coils for the same imaging position is a prerequisite for the SENSE method. This requirement is usually achieved by placing the RF coils at physically different locations with respect to the region of interest. With the SENSE method and two different RF receiving coils the number of phase encoding steps can be reduced, and consequently also the amount of acquired data, by a factor of two. This is particularly advantageous with respect to reduction of imaging time.

If only a single RF receiving coil is present the usual approach to SENSE would not work. However, if a single coil is positioned at two different locations two independent partially encoded acquisitions at the same position of the imaged object can be made, so that the SENSE method can be applied. The data available at the end of such a scan is identical to the usual SENSE acquisition except that acquisition time is twice as long, which is as long as normal acquisition without SENSE. The advantage of this acquisition method is that a larger FOV is obtained than either the RF receiving coil or the magnet homogeneity, gradient linearity and RF transmitting uniformity allow. This situation exists in the case of magnets with a short imaging volume along the Z axis.

Figure 1A:
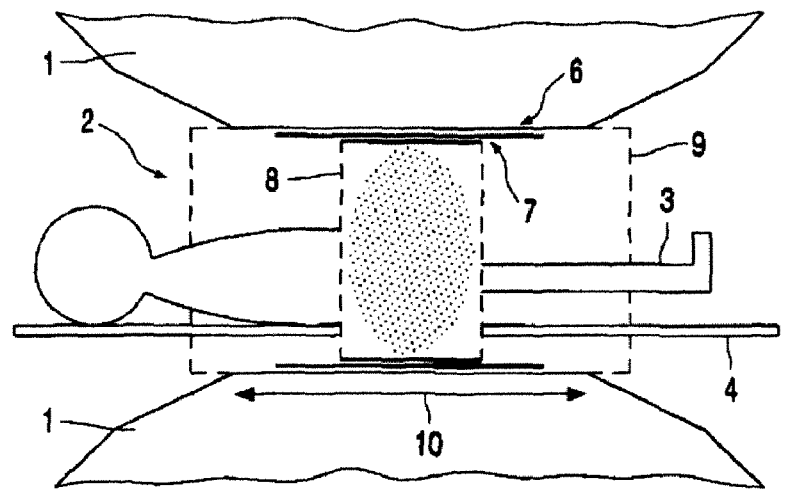
FIGS. 1a-1c are schematic views of a patient at three different positions moved through the bore of a main magnet for MR imaging.
Figure 1B:
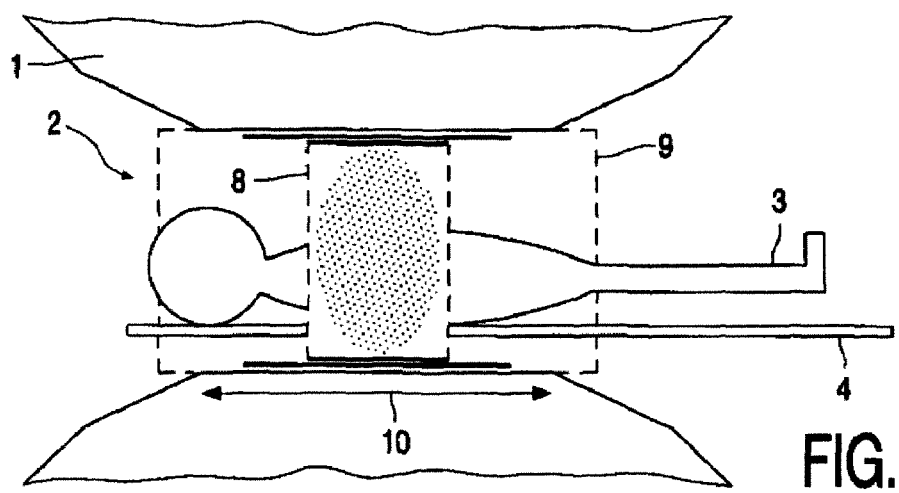
Figure 1C:
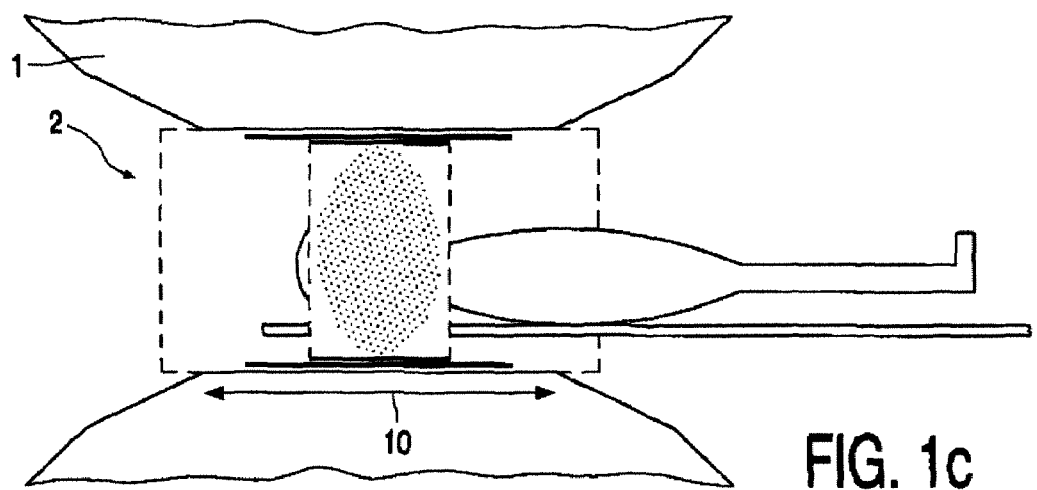
Figure 2A:
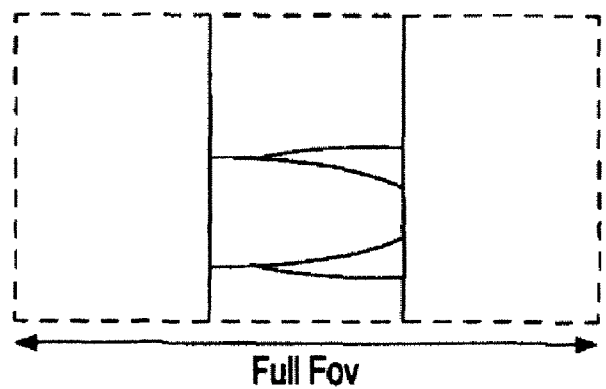
FIGS. 2a-2c illustrate the data for each table position of FIG. 1.
Figure 2B:
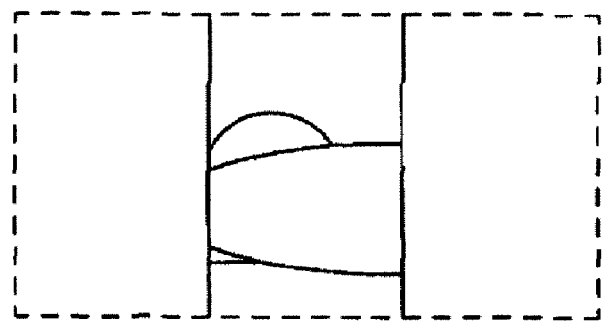
Figure 2C:
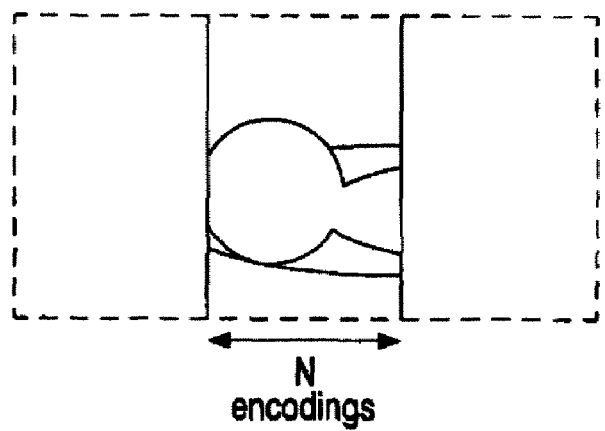
Figure 3:
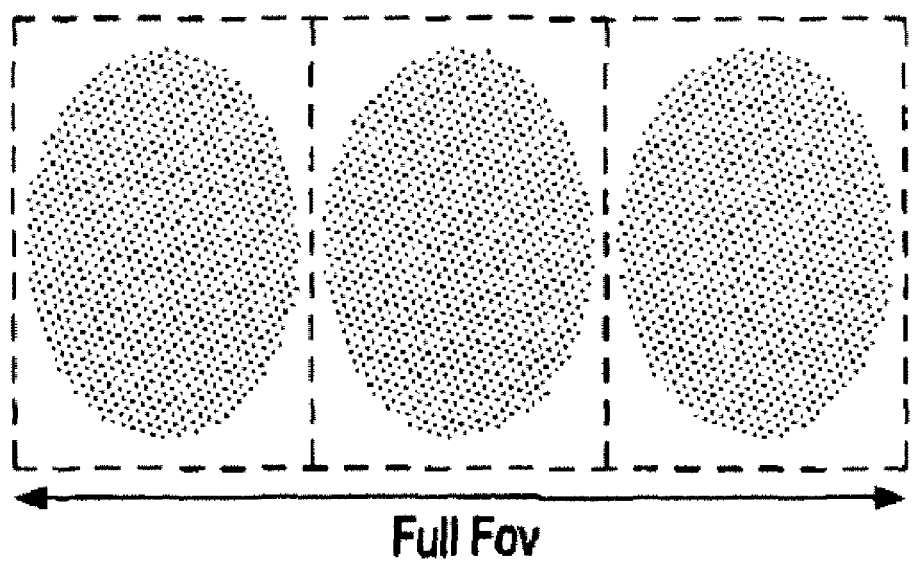
FIG. 3 illustrates the virtual sensitivity map for the full FOV.
Figure 4:
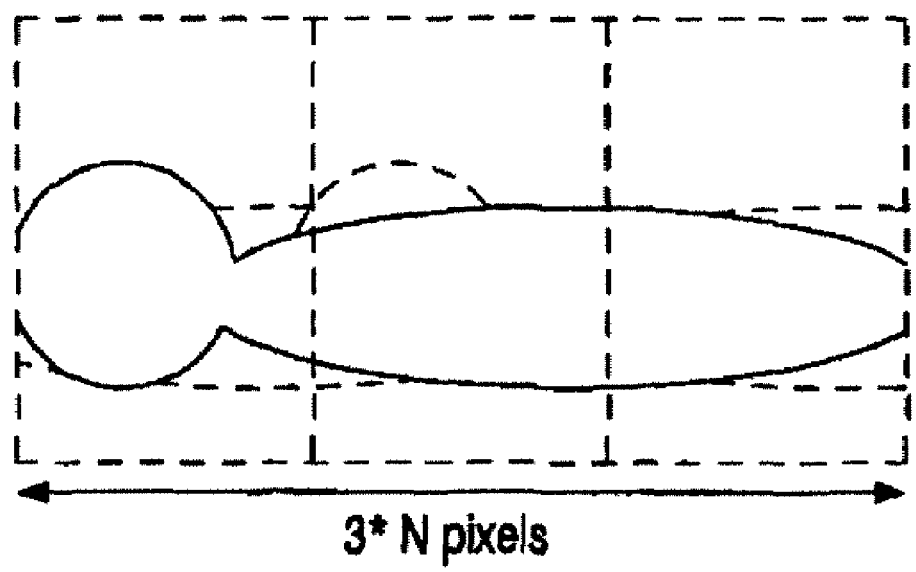
FIG. 4 is a schematic representation of the final image and FOV after reconstruction.

In FIGS. 1a-e, the contours of a main magnet 1 with a magnet bore 2 is schematically depicted. A patient 3 on a movable table 4 can be moved through the bore 2 in discrete steps, here at three different table positions in which the abdomen of the patient is scanned (FIG. 1a), the breast of the patient is scanned (FIG. 1b) and the head of the patient is scanned (FIG. 1c). Within the main magnet 1 there are mounted a transmitting quadrature body coil 6 and a smaller receiving quadrature body coil 7. The receiving coil 7 is defining the dimensions of the Field-of-View (FOV) of the image. In this example data with the restricted FOV 8 of the receiving coil 7 are sampled, in order to form a single MR-image of the entire region of interest or full FOV 9 as indicated by the dashed lines. Arrow 10 indicates the encoding and/or foldover direction. The subsequent data sampled at the three table positions are reconstructed by the SENSE method. In FIGS. 2a-c, the images at each table position encoded for the full FOV 9 are shown, whereas different fold-over artefacts are obtained from each different scan. In FIG. 3 the virtual coil sensitivity map for each of the table positions are shown, which is actually a triplicate of the single sensitivity map of the single receiving coil 7. From the sensitivity map of the full FOV (FIG. 3) an unfolded image can be reconstructed as shown in a schematic representation of the final image and the full FOV. The total number of encodings acquired is just the same as if a fully encoded scan would be possible on the full FOV, here 3 * N pixels as N encodings are provided for the restricted FOV.

In an alternative embodiment it is possible to utilize a single coil for transmission of RF signals and for receiving RF signals. In this case the sensitivity information required for the SENSE reconstruction must be supplied by an alternative means such as calculation of the theoretical sensitivity behavior.

Figure 5A:
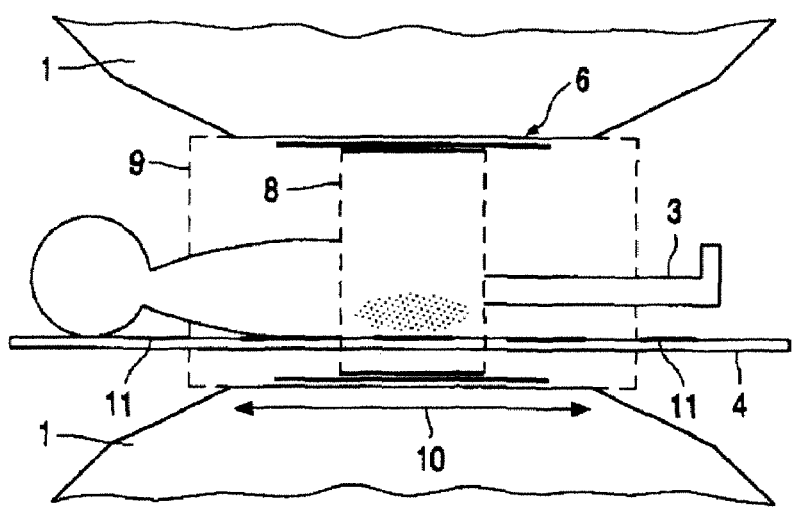
FIGS. 5a-5c illustrate an arrangement with a separate array of body coils mounted on the patient table.
Figure 5B:
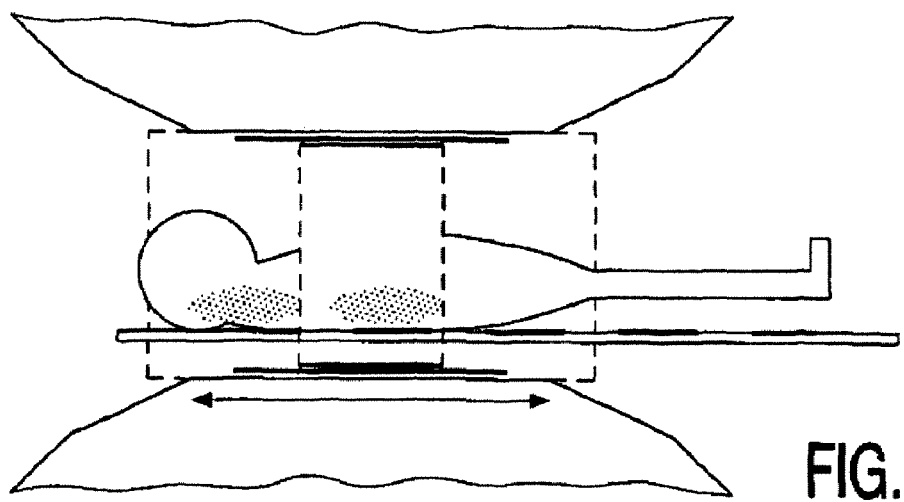
Figure 5C:
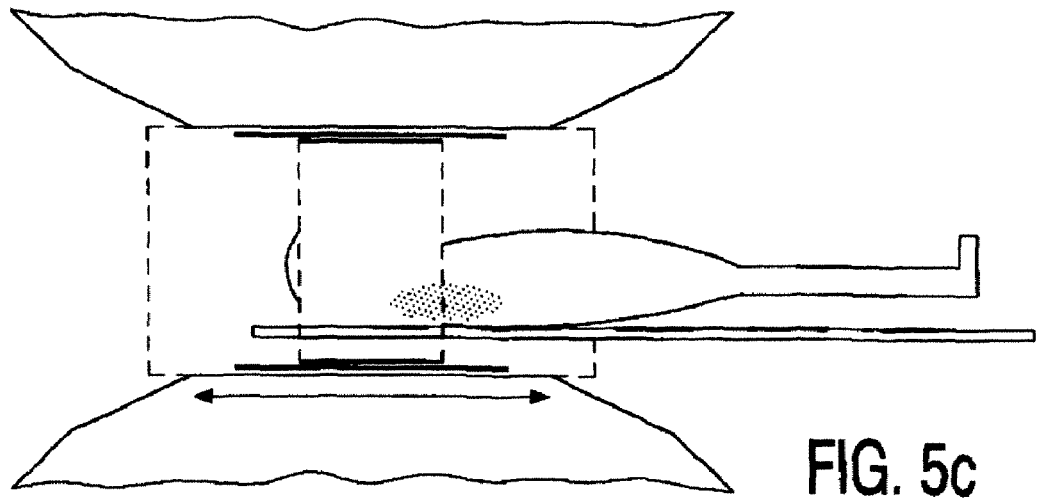

Another embodiment of the present invention is shown in FIGS. 5a-c in which an array of local surface coils 11 are mounted at a fixed position relative to the patient 3, i.e. relative to the table 4. Thus, these coils 11 are moved by the table movement and only the ones which are positioned within the restricted FOV of the transmitting coil 6 are activated to receive the transmitted RF signals. In this case the sensitivity maps of the coils 11 are needed to reconstruct the final image by the SENSE method.

The above mentioned approach has particular advantages in the case of short main magnets with a restricted nominal FOV, which enables a much larger FOV to be imaged in a shorter time than would otherwise be necessary. For this reason shorter magnets can be used which is especially advantageous for patients with a tendency to claustrophobia Although the method is described with three different table positions it will be clear to the skilled person that the method can already be applied with two different positions. Otherwise, a much larger amount of table positions can be applied too. With suitable receiver coils it is also possible to combine this approach with the conventional SENSE method singly or simultaneously along both the direction of the table movement and any other orthogonal direction.

Figure 6:
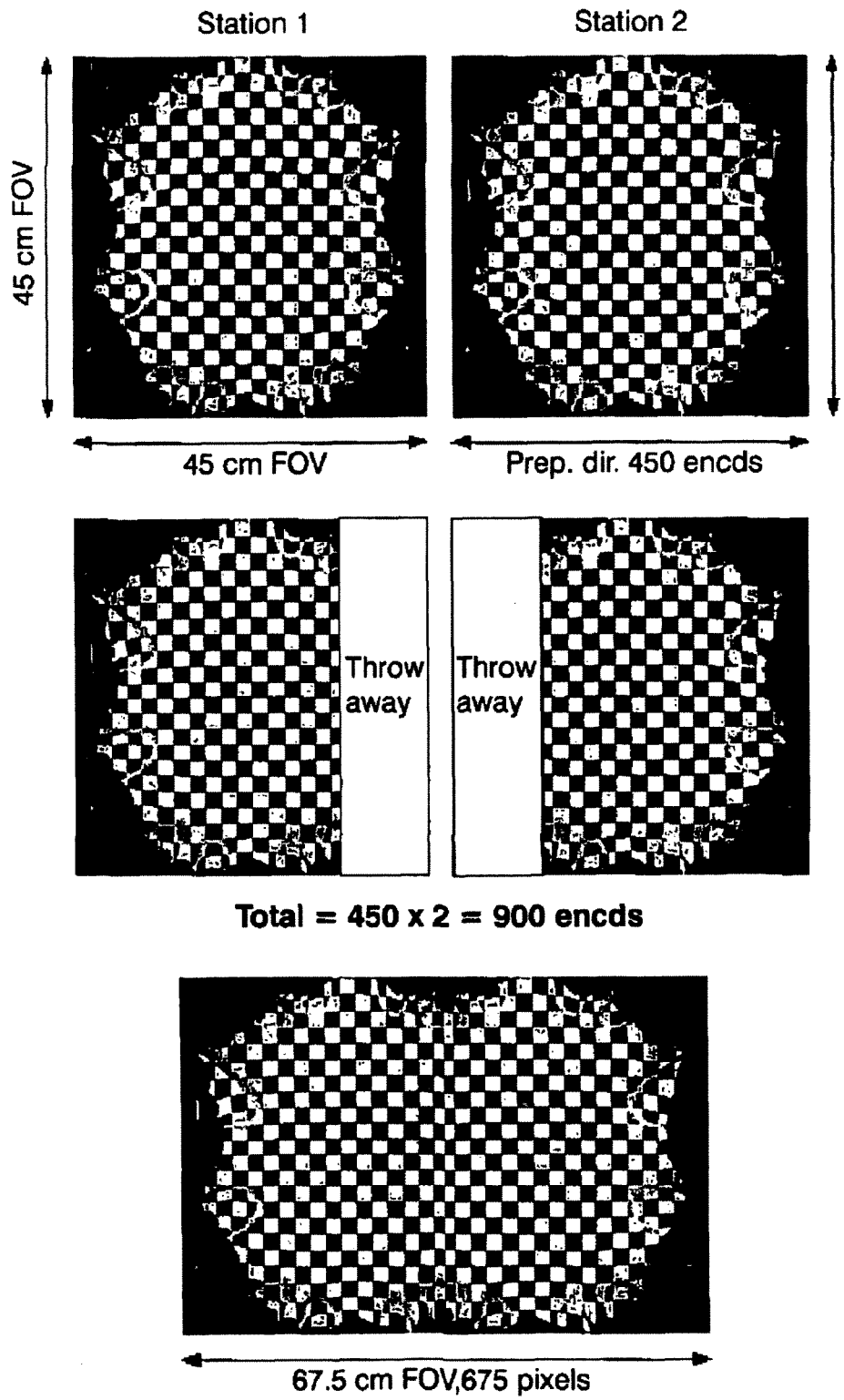
FIG. 6 is illustrative of prior art imaging showing data from two separated stations of the phantom and the combination of both data sets.

FIG. 6 illustrates a prior art example of imaging with two stations. When the measurement (phase encoding) gradient is orientated along the direction of the table movement in feet to head direction (FH), it is necessary to acquire a larger FOV at each station so as to avoid image folding. The extra data is then discarded at the places indicated so that the image sections from the two stations can be combined. In this example, each station requires 450 encodings in order to generate a full FOV equivalent to 675 encodings. So, a total of 900 encodings are required to generate a full FOV equivalent to 675 encodings. This represents an additional scan-time overhead of 25%.

Figure 7:
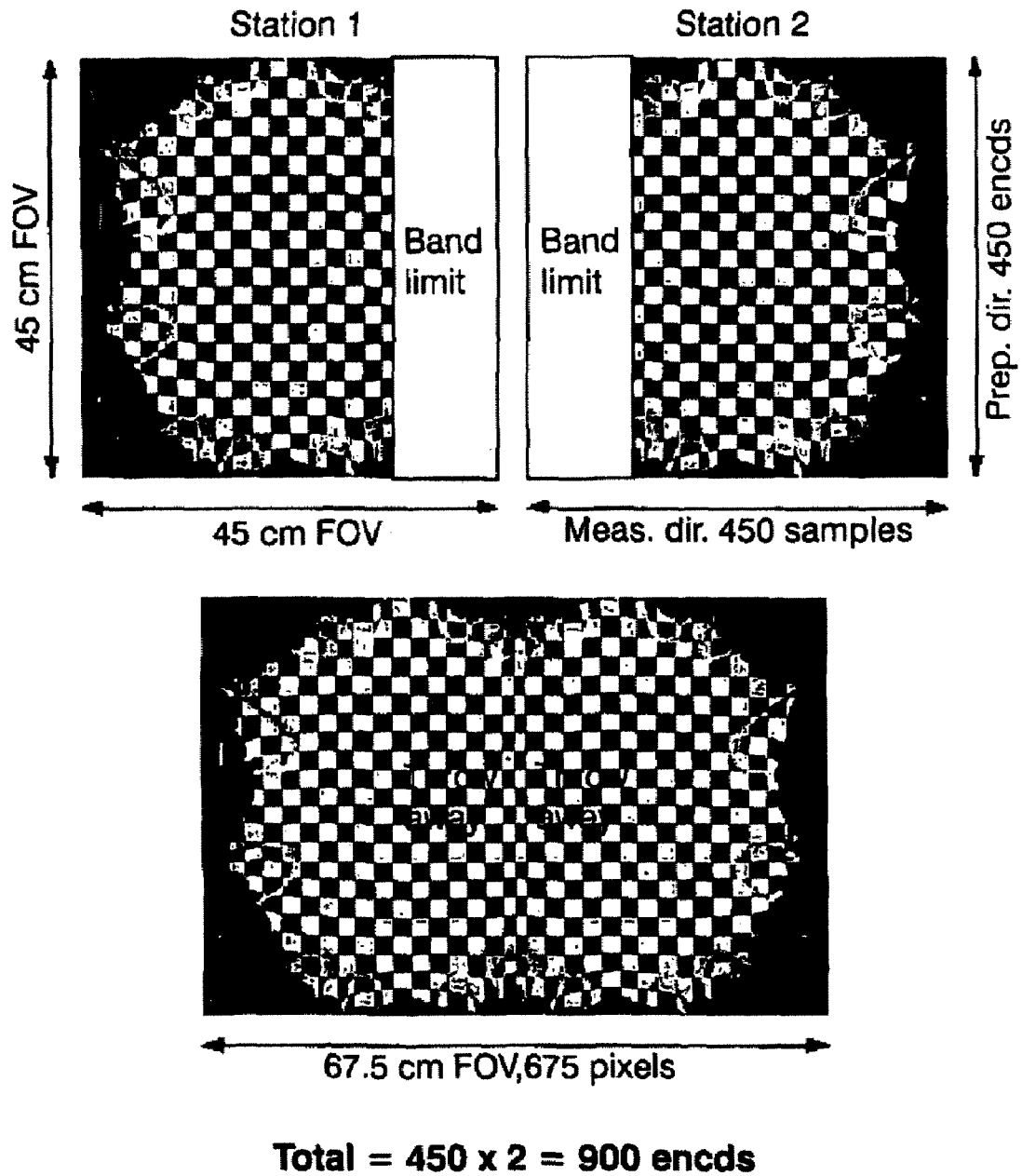
FIG. 7 illustrates prior art imaging showing data measured by the same stations as in FIG. 6 with a band limiting filter in the measurement (frequency encoding) direction.

FIG. 7 illustrates an alternative prior art example of imaging with two stations with a band limiting filter in the measurement (frequency encoding) direction. In this example, the measurement (frequency encoding) gradient is orientated along the direction of table movement (FH). The advantage of doing this is that the data, at the point of image combination, can either be bandwidth limited during acquisition or simply thrown away after reconstruction. Since this is the frequency encoding direction there is no time penalty. However, in order to avoid folding in the left to right direction (LR), it is still required to oversample along the encoding direction to the full FOV. Once again, in this example, each station requires 450 encodings, and 900 in total, to realize a full FOV equivalent to 675 encodings. The additional scan-time overhead of 25% remains.

Figure 8A:
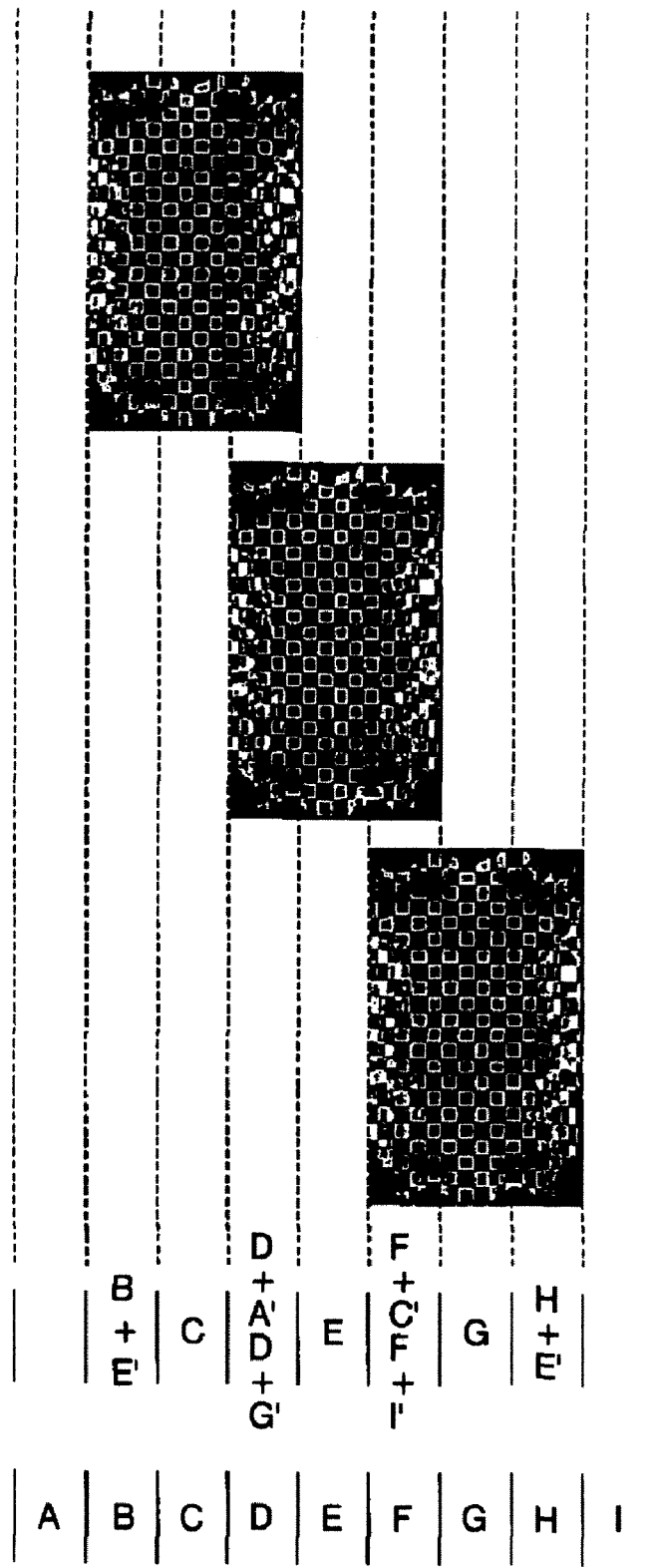
FIGS. 8a-8c illustrate a first embodiment according to the present invention showing a phantom scanned at 3 different positions moved through the bore of the main magnet of an MR imaging system.
Figure 8B:
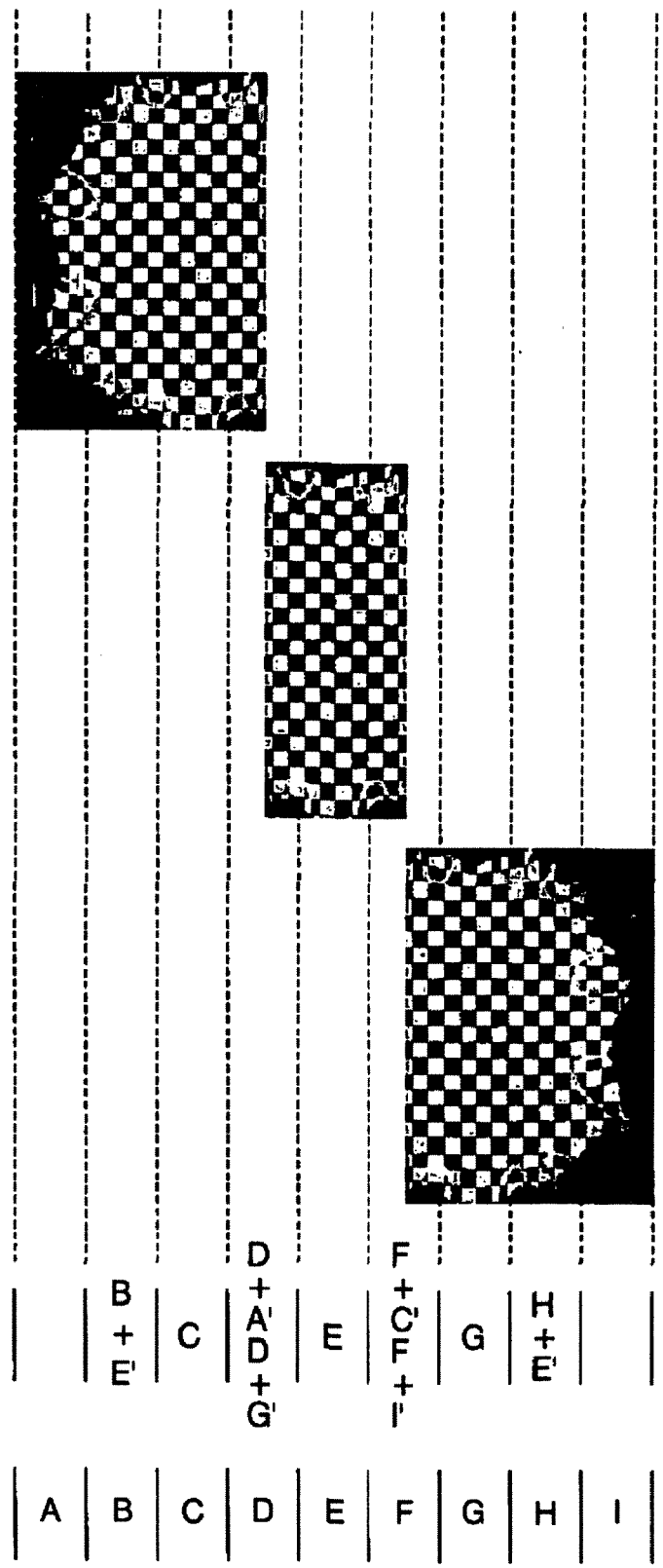
Figure 8C:
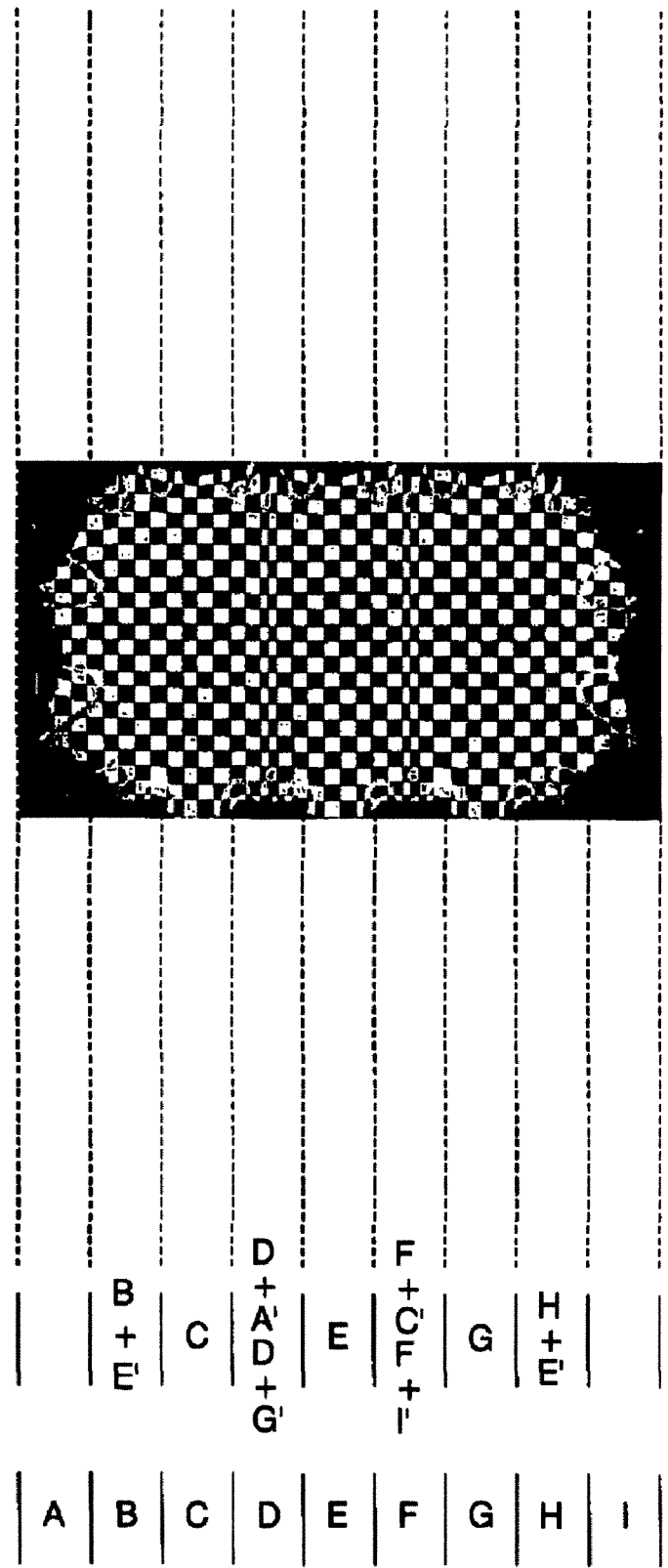

FIG. 8 represents a first embodiment of the invention showing a phantom scanned in three different positions moved through the bore of the main magnet of an MR imaging system. In order to decode the information from the data obtained by the SENSE scan at different adjacent positions as shown and described with respect to FIG. 1 additional information is needed from the neighboring scans. This can e.g. be obtained by providing overlapped scans as can be seen in FIG. 8a. Suppose that the full FOV ranges over slices A to I and the 3 scans are made with a SENSE factor of 1.66. Then for the left scan the information of slices A and E are folded-in in slices D and E respectively, for the middle scan the information of slices C and G are folded-in in slices D and F respectively, and for the right scan the information of slices E and I are folded-in in slices H and F respectively. The adjacent regions D and F can be unfolded since the sensitivity maps of RF coil 7 from the position of the left image and the middle image, and from the middle image and the right image respectively are known. After unfolding half of the region D and F will be discarded (see FIG. 8b), or corrected and co-added, in order to obtain a contiguous image in these regions. From the unfolding in region D the unfolded information of region A can be obtained, so that the full information of region A by the SENSE method will be recovered. In the same manner region I can be unfolded and so the complete image over the full FOV will be obtained (see FIG. 8c). In this embodiment, N encodings are acquired at each of the 3 stations in order to realize a full FOV of 3*N pixels.

Figure 9:
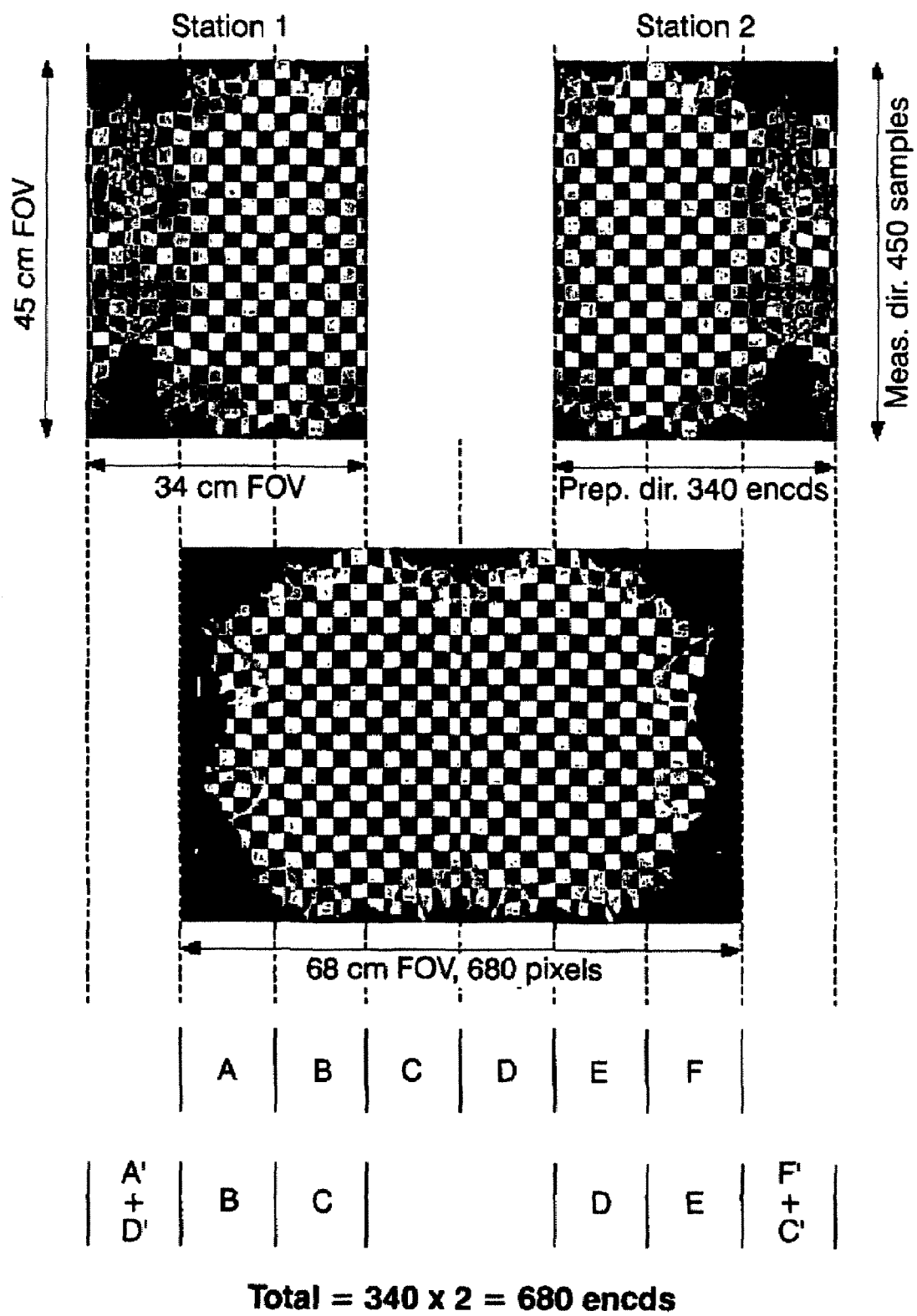
FIG. 9 illustrates a second embodiment according to the present invention, wherein data is measured as in FIG. 6 with a SENSE factor of 1.33 at each station.

FIG. 9 shows the second embodiment which illustrates how the invention provides an advantage over the prior art described in FIGS. 6 and 7. In this example, the encoding direction is orientated along the direction of table movement.

Instead of acquiring 450 encodings per station, 340 encodings are acquired and the image is allowed to fold. The position where folding appears can be controlled during the acquisition by applying a phase increment to the receiver demodulation frequency for each encoding step. In this manner, the folded region is moved from the center edge of the image from each station to the outer edge. The same effect can be achieved after reconstruction by scrolling the images. The lower image of FIG. 9 illustrates the combination of the images from both stations. The regions B, C, D and E can be easily connected. However, the regions A and F are folded with regions D and C respectively. In the acquired data representation (top diagram), the regions A and D are folded together. In actuality, these regions are acquired at the periphery of the homogeneous region of the imaging volume and so it is likely that regions A and D will be geometrically distorted due to the poor homogeneity in those regions. This fact is indicated by the apostrophe in A' and D'. Where A' represents a geometrically distorted version of region A and D' a geometrically distorted version of region D. The same is true for the second station data where region C is folded in region F. Here, the presence of geometric distortion is indicated by the apostrophe in F' and C'. To unfold the data in these two regions it is necessary to take the geometric distortion into account.

Figure 10:
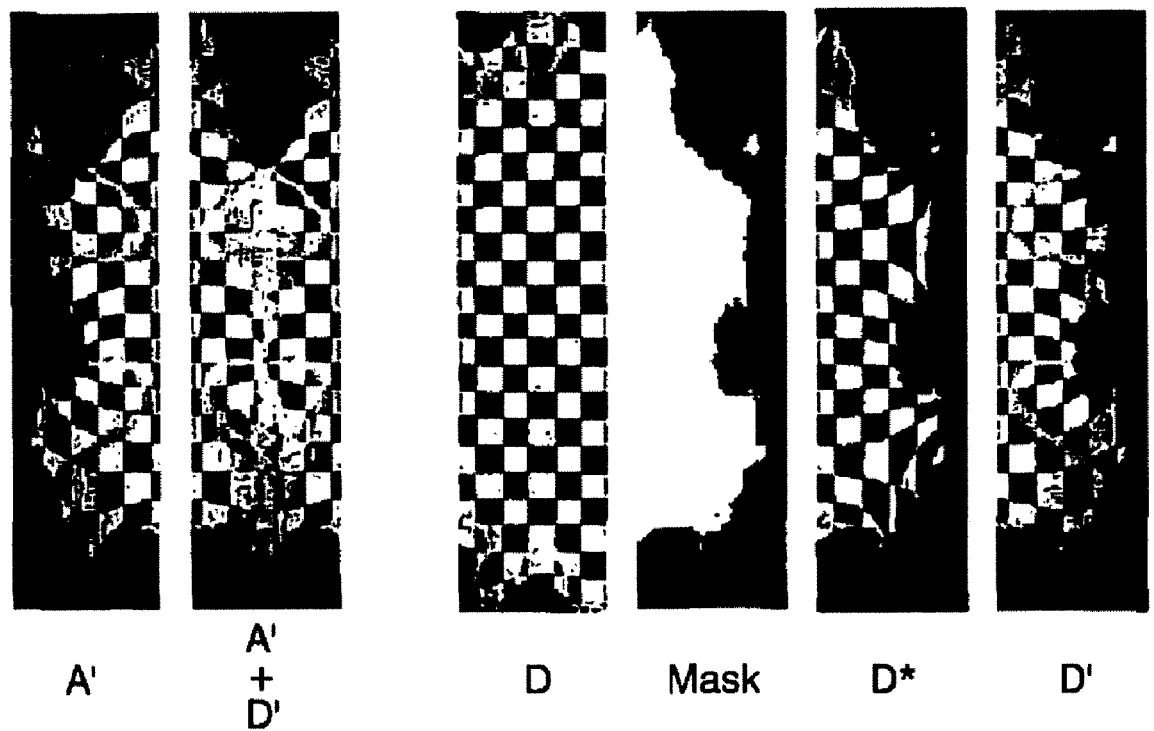
FIG. 10 illustrates the different steps for decoding the data according to the present invention.

FIG. 10 illustrates the steps required to unfold A' and D' while taking the geometric distortion into account. It should be understood that, when the magnet homogeneity and gradient coil linearity are known, image geometric distortion can be corrected by warping or morphing the pixels back to a calculated correct position. The converse is also true i.e. a given portion of an image can be pre-distorted in a manner similar to the effect that a known magnet homogeneity and gradient coil linearity would produce. This reciprocal relationship is used here. With reference to FIG. 10, the image section A'+D' represents the acquired data including geometric distortion, from station 1 of FIG. 9. The image section D represents the acquired, undistorted, data from station 2. With knowledge of magnet homogeneity and gradient coil linearity it is possible to pre-warp D and, after suitable masking, generate D*. D* is essentially equivalent to D' and can be used in combination with the acquired A'+D' image section to separate out the region A'. If desired, the separate A' region can be further corrected (shown in FIG. 9) to remove the effects of geometric distortion before combining into the full image. With reference to FIG. 9, the same approach can be used to separate F' from F'+C' to generate F. This is all possible because each of the image sections involved are acquired while the table top is at different positions with respect to the sensitivity profile of the receiving coil. Image regions A'+D', D, C and F'+C', by virtue of the multi-station acquisition, are each acquired at a uniquely different region of the receiving coil sensitivity.

Figure 11:
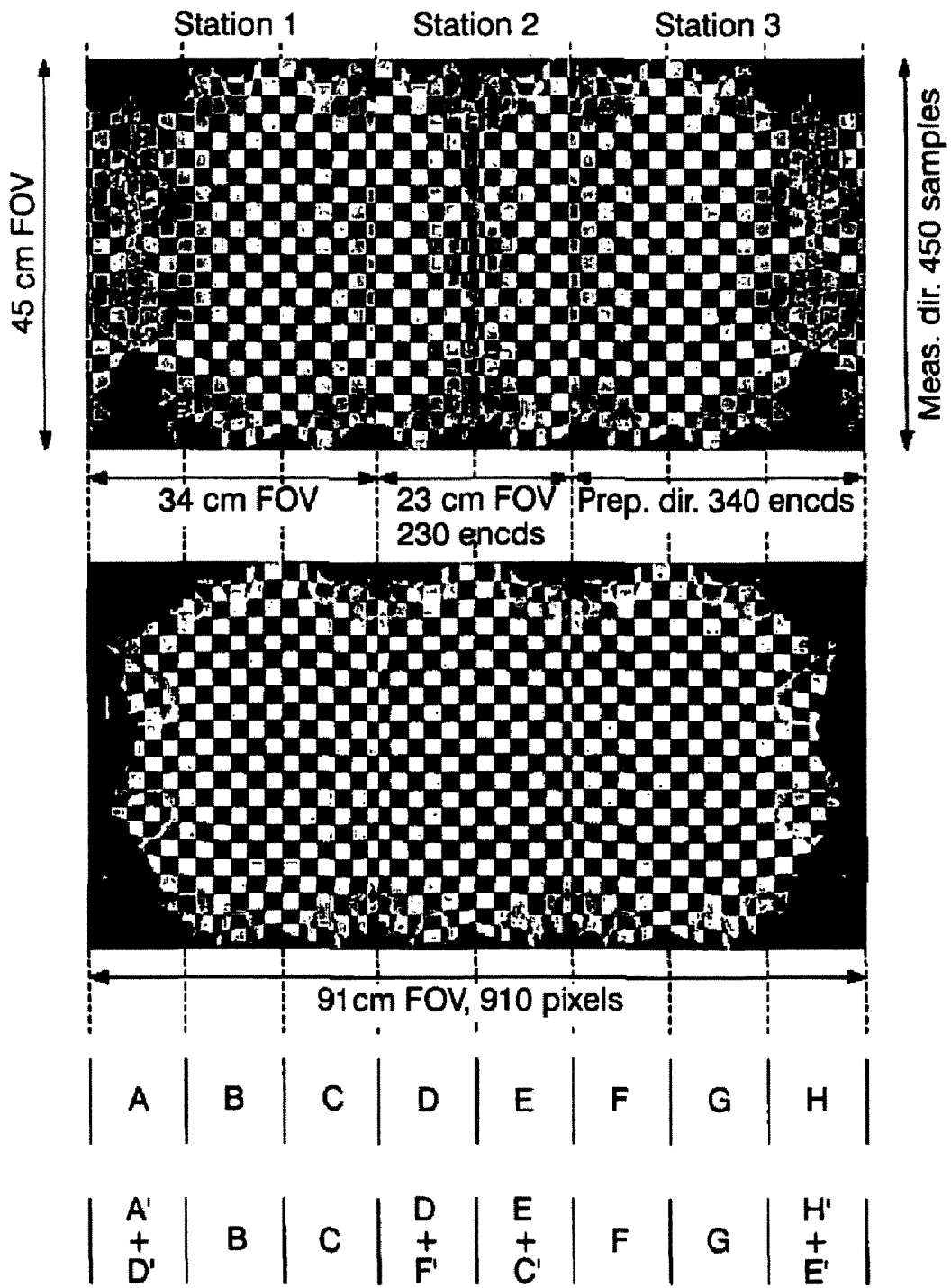
FIG. 11 illustrates a third embodiment according to the present invention, wherein data is measured at three separate stations, with different SENSE factors and its reconstruction.

FIG. 11 describes a further embodiment in the case of a 3 station acquisition. In this embodiment, the different stations have different SENSE factors. The two stations either end of the full FOV use a SENSE factor of 1.33 and the middle station uses a SENSE factor of 2.0. Compared to the alternative acquisition, a total of 910 encodings are acquired versus the alternative of 1350. This represents a total scan-time saving of 33%. Regions F'+D and F can be used to determine D. Region D, together with region A'+D', can be used to determine region A. Likewise, region E+C' and C can be used to determine region E. Region E, together with region H+E can be used to determine region H.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance method for forming a dynamic image from a plurality of signals of an object moving relative to at least one RF receiving antenna, wherein imaging is acquired by at least two adjacent fields of view (FOV), which are reconstructed to an image over a region of interest which includes the at least two adjacent FOVs, wherein
   a sensitivity map of the at least one RF receiving antenna at each position relative to the object determined by each FOV is provided,
   data from the object to be imaged is subsampled for each FOV with a reduced number of phase encoding steps with respect to the full set thereof at a fixed imaging position relative to the main magnetic field, and
   the image is reconstructed from the subsampled data, which are weighted with the sensitivity factor of the RF receiving antenna at the respective imaging position.

2. The magnetic resonance method according to claim 1, wherein a single RF receiving antenna is used.

3. The magnetic resonance method according to claim 1, wherein a single RF transmitting antenna is used, wherein the size of the transmitting antenna is larger than the size of the receiving antenna.

4. The magnetic resonance method according to claim 1, wherein a single RF antenna is provided for transmitting and receiving RF signals.

5. The magnetic resonance method according to claim 1, wherein an array of RF receiving antennae is used.

6. The magnetic resonance method according to claim 1, wherein the data sampled for one of the FOVs is folded into data sampled for an adjacent one of the FOVs.

7. The magnetic resonance method according to claim 6, wherein reconstructing the image includes;
   using the folded data in the one of the FOVs and the sensitivity map to unfold the folded data in the adjacent one of the other FOVs.

8. The magnetic resonance method according to claim 6, wherein reconstructing the image includes:
   unfolding the folded data in one adjacent FOV in accordance with the folded data in the other adjacent FOV and the sensitivity map; and
   splicing the unfolded data from the adjacent FOVs together.

9. The magnetic resonance method according to claim 6, further including:
   applying a phase increment to a receiver demodulation frequency for each of the encoding steps to move a folded region of at least one of the FOVs from a center edge to an outer edge.

10. The magnetic resonance method according to claim 6, further including:
    correcting for geometric distortion by warping or morphing pixels in accordance with magnetic homogeneity and gradient coil linearity.

11. The magnetic resonance method according to claim 10, further including:
    masking a portion of the folded data prior to correcting for geometric distortion.

12. The magnetic resonance method according to claim 6, wherein an RF transmitting antenna and an array of RF receiving antenna are fixed relative to each other and further including:

moving a first region of the object into alignment with the array of RF receive coils;

with the first region of the object stationary and in alignment with the array of RF receive coils, sampling the data for a first of the at least two FOVs;

moving an adjacent region of the object into alignment with the array of RF receive coils and the first region out of alignment;

with the second region of the object stationary and in alignment with the array of RF receive coils, sampling the data for a second of the at least two FOVs, the data sampled from the first and second FOVs being folded into each other.

13. The magnetic resonance method according to claim 1, wherein a phase encoding direction is oriented along a direction of object movement.

14. A magnetic resonance imaging apparatus for obtaining a dynamic image from a plurality of signals of an object moving relative to at least one RF receiving antenna, comprising:

a patient table configured for movement through the bore of a magnet, at least one RF receiving antenna, means for providing a sensitivity map of the at least one RF receiving antenna at each position relative to the object determined by each of at least two adjacent fields of view (FOV) prior to imaging, means for sampling data from the object to be imaged for each of the at least two adjacent FOVs with a reduced number of phase encoding steps with respect to the full set thereof at a fixed position relative to the main magnetic field, and means for reconstructing an image from the sampled data, which sampled data are weighted with the sensitivity factor of the RF receiving antenna at the respective imaging position.

15. The magnetic resonance imaging apparatus according to claim 14, wherein the RF receiving antenna includes an array of coils spanning a first length that is shorter than the object and further including:

an object support configured to move regions of the object corresponding to the fields of view step-wise into alignment with the RF receiving antenna.

16. The magnetic resonance imaging apparatus according to claim 15, wherein the sampled data from each FOV is folded into an adjacent FOV and wherein the image reconstructing means unfolds the folded data using the sensitivity map and folded data from the adjacent FOV.

17. The magnetic resonance imaging apparatus according to claim 16, wherein the data sampling means applies a phase increment to a receiver demodulation frequency for each of the phase encoding steps.

18. The magnetic resonance imaging apparatus according to claim 15, wherein a phase encoding direction is oriented along a direction of object movement.

19. A computer readable medium on which is stored a program for forming a dynamic image with the magnetic resonance method by causing a computer to control the execution of:

moving a patient table for through the bore of a magnet which operates a main magnetic field, sampling data from at least one RF receiving antenna array, providing a sensitivity map of the at least one RF receiving antenna array at each position relative to a region of interest of an object which region of interest includes at least two adjacent fields of view (FOV) prior to imaging, sampling data from the object to be imaged for each of the at least two FOVs with a reduced number of phase encoding steps with respect to the full set thereof at a fixed position relative to the main magnetic field, the sampled data of each FOV being folded into sampled data of an adjacent FOV, and reconstructing the image from the sampled signals, including weighting with the sensitivity factor of the RF receiving antenna array at the respective imaging position and unfolding the folded data.

20. The computer readable medium according to claim 19, wherein the program further applies a phase increment to a receiver demodulation frequency for each of the phase encoding steps.

* * * * *